(12) United States Patent
Liou et al.

(10) Patent No.: US 10,205,005 B1
(45) Date of Patent: Feb. 12, 2019

(54) SEMICONDUCTOR DEVICE AND METHOD FOR FABRICATING THE SAME

(71) Applicant: UNITED MICROELECTRONICS CORP., Hsin-Chu (TW)

(72) Inventors: En-Chiuan Liou, Tainan (TW); Yu-Cheng Tung, Kaohsiung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/691,717

(22) Filed: Aug. 30, 2017

(30) Foreign Application Priority Data

Aug. 10, 2017 (CN) .......................... 2017 1 0679485

(51) Int. Cl.
| | | |
|---|---|---|
| H01L 29/24 | (2006.01) | |
| H01L 29/66 | (2006.01) | |
| H01L 21/8238 | (2006.01) | |
| H01L 21/225 | (2006.01) | |
| H01L 21/02 | (2006.01) | |
| H01L 27/092 | (2006.01) | |
| H01L 29/06 | (2006.01) | |
| H01L 29/161 | (2006.01) | |
| H01L 29/08 | (2006.01) | |

(52) U.S. Cl.
CPC .... *H01L 29/6681* (2013.01); *H01L 21/02129* (2013.01); *H01L 21/2256* (2013.01); *H01L 21/823807* (2013.01); *H01L 21/823814* (2013.01); *H01L 21/823821* (2013.01); *H01L 21/823828* (2013.01); *H01L 21/823878* (2013.01); *H01L 27/0924* (2013.01); *H01L 29/0649* (2013.01); *H01L 29/0847* (2013.01); *H01L 29/161* (2013.01); *H01L 29/24* (2013.01); *H01L 29/66803* (2013.01)

(58) Field of Classification Search
CPC ............... H01L 29/6681; H01L 29/161; H01L 21/2256; H01L 21/02129; H01L 21/823878; H01L 29/0649; H01L 29/24; H01L 29/0847; H01L 21/823807; H01L 21/823821; H01L 21/823814; H01L 21/823828; H01L 29/668
See application file for complete search history.

(56) References Cited

U.S. PATENT DOCUMENTS 8,263,462 B2 * 9/2012 Hung ................ H01L 29/66795
438/286
9,147,730 B2   9/2015 Xie
(Continued)

OTHER PUBLICATIONS

Liou, Title of Invention: Semiconductor Device and Method for Fabricating the Same, U.S. Appl. No. 15/378,050, filed Dec. 14, 2016.

(Continued)

*Primary Examiner* — Bilkis Jahan
(74) *Attorney, Agent, or Firm* — Winston Hsu

(57) ABSTRACT

A method for fabricating a semiconductor structure is provided in the present invention. The method includes the steps of forming a plurality of fins in a first region, a second region and a dummy region, forming a first solid-state dopant source layer and a first insulating buffer layer in the first region, forming a second solid-state dopant source layer and a second insulating buffer layer in the second region and the dummy region, and performing an etch process to cut the fin in the dummy region.

9 Claims, 7 Drawing Sheets

(56) References Cited

U.S. PATENT DOCUMENTS

| | | | |
|---|---|---|---|
| 9,455,198 B1 | 9/2016 | Yu | |
| 9,570,339 B2 | 2/2017 | Liou | |
| 9,837,417 B1* | 12/2017 | Liou | H01L 27/0924 |
| 2008/0296702 A1* | 12/2008 | Lee | H01L 21/823431 |
| | | | 257/401 |
| 2009/0261423 A1* | 10/2009 | Sawada | H01L 29/66795 |
| | | | 257/392 |
| 2011/0180847 A1* | 7/2011 | Ikeda | H01L 29/045 |
| | | | 257/190 |
| 2012/0049294 A1 | 3/2012 | Chen | |
| 2013/0119482 A1* | 5/2013 | Wann | H01L 29/66818 |
| | | | 257/401 |
| 2013/0196508 A1* | 8/2013 | LiCausi | H01L 21/823821 |
| | | | 438/696 |
| 2013/0224936 A1* | 8/2013 | Lee | H01L 21/823431 |
| | | | 438/492 |
| 2015/0069528 A1* | 3/2015 | Chiang | H01L 29/785 |
| | | | 257/401 |
| 2016/0005735 A1* | 1/2016 | Costrini | H01L 27/0886 |
| | | | 257/401 |
| 2016/0351411 A1 | 12/2016 | Xie | |

OTHER PUBLICATIONS

Tung, Title of Invention: Semiconductor Device and Method for Fabricating the Same, U.S. Appl. No. 15/062,217, filed Mar. 7, 2016.

\* cited by examiner

SEMICONDUCTOR DEVICE AND METHOD FOR FABRICATING THE SAME

BACKGROUND OF THE INVENTION

1. Field of the Invention

The present invention relates generally to a semiconductor transistor device and a method of fabricating the same. More particularly, the present invention relates to a semiconductor transistor device using a solid state doping (SSD) technique to form a doped layer in the lower half of a fin structure and a method of fabricating the same.

2. Description of the Prior Art

In recent years, as the dimensions of key components continue to shrink, the development of planar field effect transistor elements has been faced with process limitations. In order to overcome process limitations, it has become a mainstream trend to replace planar transistor elements with non-planar field-effect transistor elements, such as fin field effect transistors (Fin FET) elements.

Because the three-dimensional structure of the fin field effect transistor element can increase the contact area between the gate electrode and the fin structure, the control of the gate electrode to the carrier channel region can be further increased, thereby reducing the drain induced barrier lowering (DIBL) effect and suppressing the short-channel effect (SCE).

Moreover, because the fin field effect transistor element has a wider channel width at the same gate electrode length, a double of the drain drive current can be obtained. Even the threshold voltage of the transistor element can be controlled by adjusting the work function of the gate electrode.

The integrated microelectronic device having a FinFET architecture may rely on solid-state diffusion sources where an impurity source film is formed adjacent to a sidewall of a portion of a sub-fin region proximate to substrate. Dopants are driven from the impurity source film(s) into the portions of the sub-fin region proximate to the source films.

However, there is still improvement required in the process design of the fin structure, such as the removal of the unnecessary dummy fins between active areas at post stage. Therefore, how to improve the prior process of fin field effect transistor and develop the process for post stage is an important issue today.

SUMMARY OF THE INVENTION

One objective of the present invention is to provide a process for removing dummy fins at post solid-state doping (SSD) stage.

To achieve the objective, the preferred embodiment of the present invention provides a method for fabricating a semiconductor device, which includes the steps of providing a substrate having a first region, a second region and a dummy region, forming a plurality of fins in the first region and the second region and a dummy fin in the dummy region, forming a first solid-state dopant source layer in the first region, forming a first insulating buffer layer on the first solid-state dopant source layer, forming a second solid-state dopant source layer in the second region and the dummy region, forming a second insulating buffer layer on the second solid-state dopant source layer and on the first insulating buffer layer, and performing an etch process to cut the fin in the dummy region.

The present invention also provides a semiconductor device resulted from the method provided above, which includes a substrate having a first region, a second region and a dummy region between the first region and the second region, a plurality of fins in the first region and the second region, at least one dummy fin in the dummy region, a first solid-state dopant source layer in the first region, a first insulating buffer layer on the first solid-state dopant source layer, a second solid-state dopant source layer in the second region and the dummy region, a second insulating buffer layer on the second solid-state dopant source layer, and a dielectric layer on the substrate, wherein a top surface of the dielectric layer, the second insulating buffer layer, the first insulating buffer layer, the first solid-state dopant source layer and the second solid-state dopant source layer is lower than a top surface of the fins, and a top surface of the dummy fin is lower than the top surface of the dielectric layer, the second insulating buffer layer, the first insulating buffer layer, the first solid-state dopant source layer and the second solid-state dopant source layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute apart of this specification. The drawings illustrate some of the embodiments and, together with the description, serve to explain their principles. In the drawings.

Figure 1:
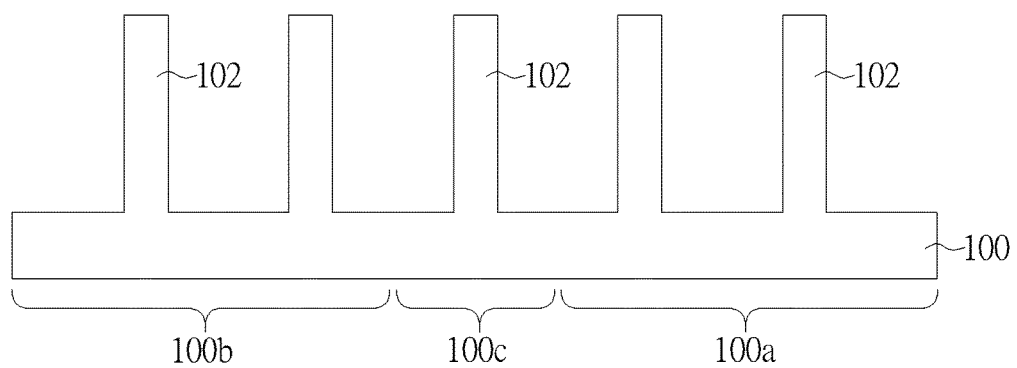
FIGS. 1-8 are cross-sectional views schematically illustrating the process for fabricating the semiconductor structure in accordance with one embodiment of the present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the invention, reference is made to the accompanying drawings, which form a part hereof, and in which is shown, by way of illustration, specific embodiments in which the invention may be practiced. These embodiments are described in sufficient detail to enable those skilled in the art to practice the invention. Other embodiments may be utilized and structural, logical and electrical changes may be made without departing from the scope of the present invention. The following detailed description is, therefore, not to be taken in a limiting sense, and the scope of the present invention is defined only by the appended claims, along with the full scope of equivalents to which such claims are entitled.

Before describing the preferred embodiment, the following description will be given for specific terms used throughout the specification. The term "etch" or "etching" is used herein to generally describe a fabrication process of patterning a material, such that at least a portion of the material remains after the etch is completed. For example, it should be understood that the process of etching silicon involves the steps of patterning a photoresist layer above the silicon, and then removing the areas of silicon no longer protected by the photoresist layer. As such, the areas of silicon protected by the photoresist layer would remain behind after the etch process is complete. However, in another example, etching may also refer to a process that does not use a photoresist layer, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, "removing" is considered to be a broad term that may incorporate etching.

The term "substrate," "semiconductor substrate" or "wafer" as described throughout, is most commonly a silicon substrate or a silicon wafer. However, term "substrate" or "wafer" may also refer to any semiconductor material such as germanium, gallium arsenide, indium phosphide, and the like. In other embodiments, the term "substrate" or "wafer" may be non-conductive, such as a glass or sapphire wafer.

FIG. 1 to FIG. 8 are schematic cross-sectional views illustrating an exemplary process of fabricating a semiconductor transistor device in accordance with one embodiment of the invention. First, as shown in FIG. 1, a semiconductor substrate 100 is provided. The semiconductor substrate 100 includes a first region 100a, a second region 100b and a dummy region 100c between the first region 100a and the second region 100b. For example, the first region 100a may be a NMOS region and the second region 100b may be a PMOS region. The first region 100a and the second region 100b do not overlap each other. Next, a plurality of fins 102 are formed in the first region 100a, the second region 100b and the dummy region 100c, respectively. In the embodiment, the dummy region 100c is formed, but not limited, in the outer peripheral area of the second region 100b. It may also be formed in the outer peripheral areas of the first region 100a in other embodiments. The process of forming the semiconductor fins on a semiconductor substrate is well known and may include steps such as lithography and etching, which are not described in any detail.

According to the embodiment of the invention, the top of each fin 102 may be optionally provided with a pad oxide layer (not shown), such as a silicon dioxide layer, and a hardmask layer (not shown), such as a silicon nitride hardmask layer. Further, an oxide layer (not shown) may be optionally formed on the fins, such as a silicon oxide layer formed by in-situ steam generation (ISSG), but is not limited thereto.

Figure 2:
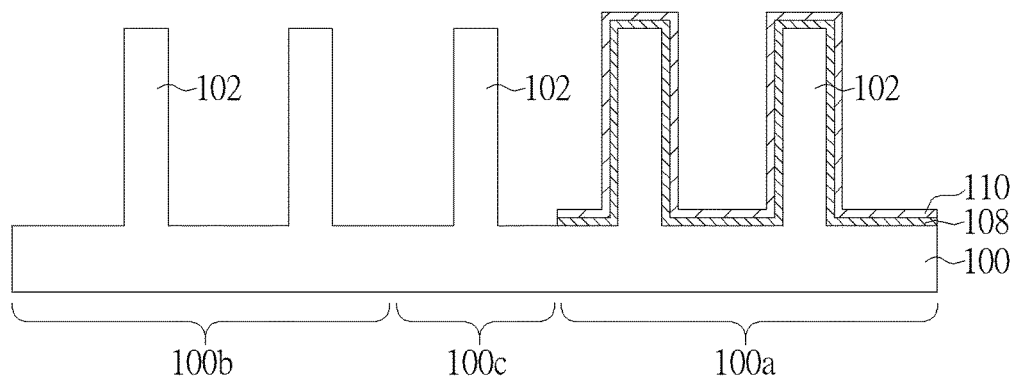

Next, as shown in FIG. 2, a first solid-state dopant source layer 108 is formed in the first region 100a on the semiconductor substrate 100, for example, by a chemical vapor deposition method. The first solid-state dopant source layer 108 is deposited conformally on the semiconductor substrate 100. According to the embodiment of the present invention, the first solid-state dopant source layer 108 may include p-type dopants, such as a borosilicate glass (BSG) layer, but is not limited thereto. A first insulating buffer layer 110 is then formed on the first solid-state dopant source layer 108 in the first region 100a. The first insulating buffer layer 110 may include silicon nitride, but is not limited thereto. The first insulating buffer layer 110 may be formed by a chemical vapor deposition method.

To be detailed, the first solid-state dopant source layer 108 and the first insulating buffer layer 110 may be formed first on the entire substrate 100, an etching mask (not shown), such as a photoresist, is then masked on the first region 100a without masking the second region 100b and the dummy region 100c. An etching process is then performed to remove the first solid-state dopant source layer 108 and the first insulating buffer layer 110 not covered by the etching mask from the second region 100b and the dummy region 100c, so that the first solid-state dopant source layer 108 and the first insulating buffer layer 110 are formed only covering the first region 100a. The etching mask is removed subsequently after the etching process.

Figure 3:
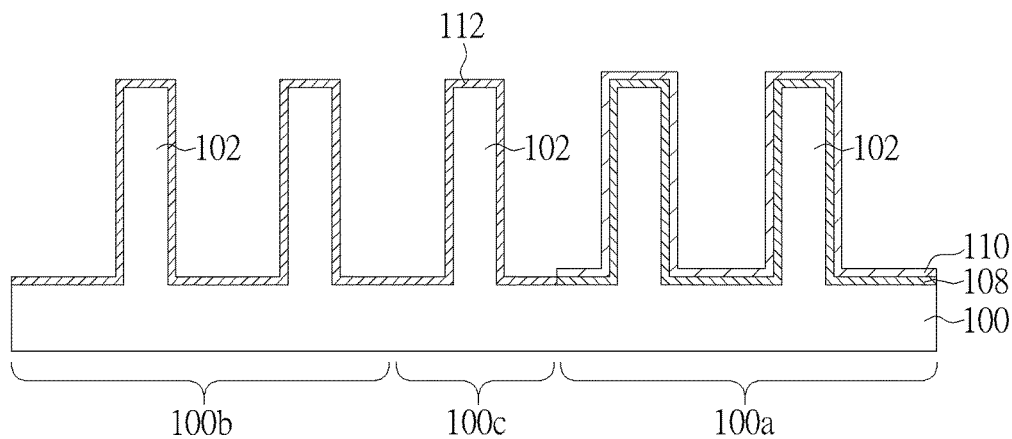

Next, as shown in FIG. 3, the second solid-state dopant source layer 112 is deposited in the second region 100b on the semiconductor substrate 100, for example, by a chemical vapor deposition method. The second solid-state dopant source layer 112 is deposited conformally on the semiconductor substrate 100. According to the embodiment of the present invention, the second solid-state dopant source layer 112 may include n-type dopants, such as a phosphosilicate glass (PSG) layer or an arsenic silicate glass (AsSG) layer, but is not limited thereto.

To be detailed, the second solid-state dopant source layer 112 may be first formed on the entire substrate 100, an etching mask (not shown), such as a photoresist, is then masked on the second region 100b without masking the first region 100a. An etching process is then performed to remove the second solid-state dopant source layer 112 not covered by the etching mask in the first region 100a, to thereby expose the first insulating buffer layer 110 in the first region 100a, so that the second solid-state dopant source layer 112 is formed only in the second region 100b and the dummy region 100c. The etching mask is removed subsequently after the etching process.

Figure 4:
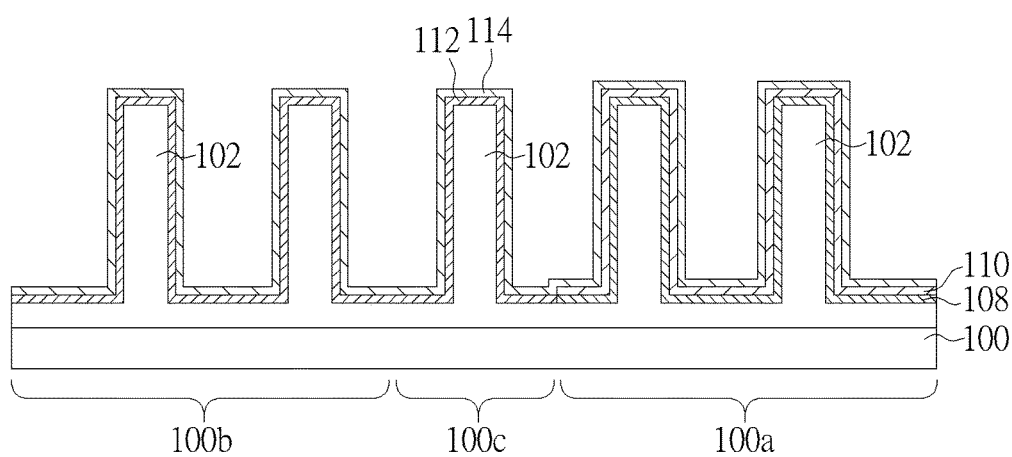

As shown in FIG. 4, a second insulating buffer layer 114 is then formed on the first insulating buffer layer 110 in the first region 100a and on the second solid-state dopant source layer 112 in the second region 100b. The second insulating buffer layer 114 may include silicon nitride, but is not limited thereto. The second insulating buffer layer 114 may be formed by a chemical vapor deposition method.

Figure 5:
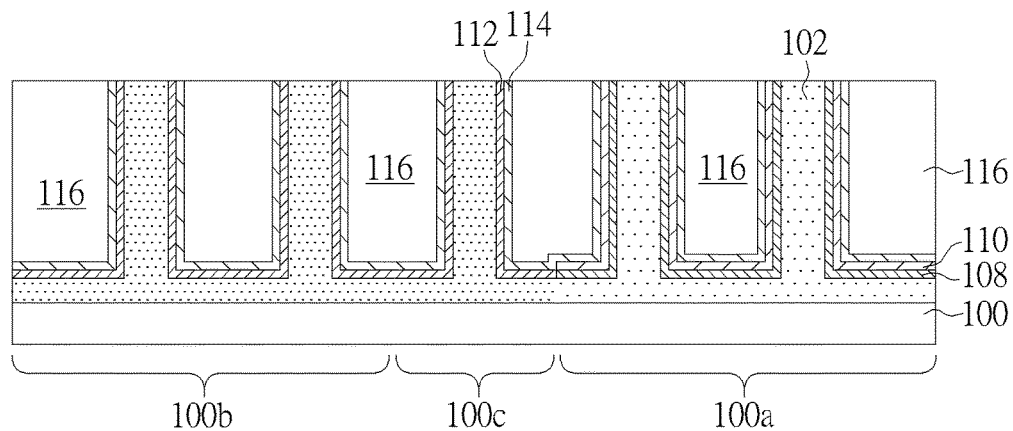

Next, as shown in FIG. 5, a dielectric layer 116, for example, a silicon dioxide layer, is formed on the substrate 100 between the fins 102. According to the embodiment of the invention, the dielectric layer 116 may be formed by a chemical vapor deposition method, but is not limited thereto, to fill the recesses between the semiconductor fins. Furthermore, a planarization process such as chemical mechanical polishing (CMP) is then performed to remove parts of the dielectric layer 116 and the fins 102 to a predetermined level. The top surfaces of the dielectric layer 116, the fins 102, the first solid-state dopant source layer 108, the second solid-state dopant source layer 112, the first insulating buffer layer 110 and the second insulating buffer layer 114 are flush after the planarization process.

Furthermore, after the above planarization process, a thermal doping process is performed to drive dopants from the first solid-state dopant source layer 108 and the second solid-state dopant source layer 112 into the fins 102 in the first region 100a, the second region 100b and the dummy region 100c, respectively. In this way, the doped portions with different conductive type are formed respectively in the fins 102 in the first region 100a and the second region 100b, respectively. The doped portion may also be formed extending into the substrate 100 with a predetermined thickness in addition to the fins 102.

Figure 6:
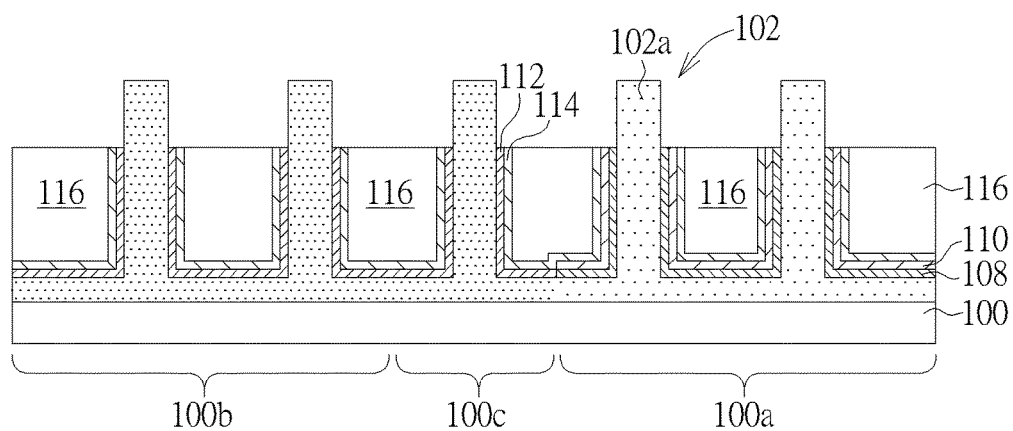

Subsequently, as shown in FIG. 6, the dielectric layer 116, the second insulating buffer layer 114, the first insulating buffer layer 110, the first solid-state dopant source layer 108 and the second solid-state dopant source layer 112 are recessed to a predetermined level below a top surface of the fins 102, to thereby expose protruding portion 102a of each fin 102. The level to which the first solid-state dopant source layer 108 and the second solid-state dopant source layer 112 are recessed would determine the channel portion in each fin 102.

Figure 7:
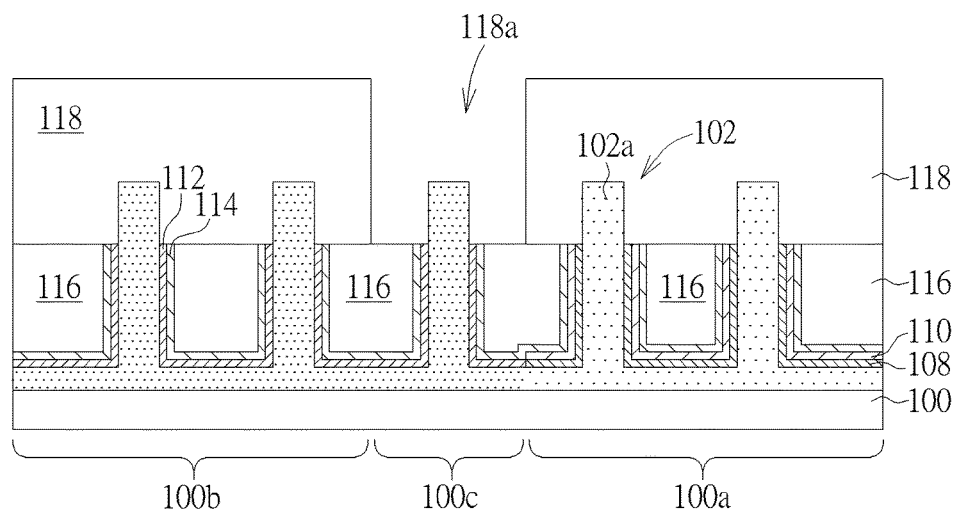

Next, as shown in FIG. 7, the first region 100a and the second region 100b are masked by an etching mask 118, such as a photoresist. The etching mask 118 has opening 118a exposing only the fin 102 in the dummy region 100c between the first region 100a and the second region 100b.

Figure 8:
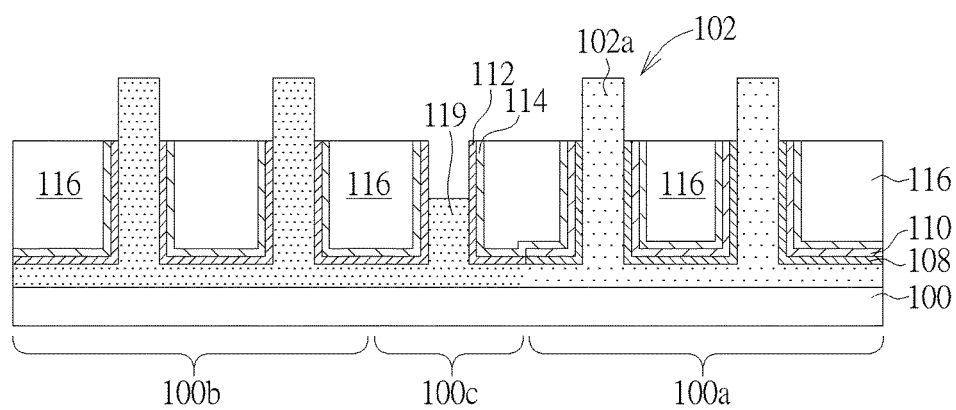

After the etching mask 118 is formed, an anisotropic dry etching process is then performed to etch the fin 102 exposed from the opening 118a, so that the fin is cut to a level lower than the top surface of the dielectric layer 116 and forms a dummy fin 119, as shown in FIG. 8. Thereafter, the etching mask 118 is removed.

The dummy fin 119 in this embodiment is provided with the second solid-state dopant source layer 112 and the second insulating buffer layer 114 at both sides, However, in other embodiment, the dummy fin 119 may be provided with the second solid-state dopant source layer 112 and the second insulating buffer layer 114 at one side and the first solid-state dopant source layer 108 and the second insulating buffer layer 110 at the other side, depending on the predetermined region of the first solid-state dopant source layer 108 and the second solid-state dopant source layer 112 in the forming process.

Figure 9:
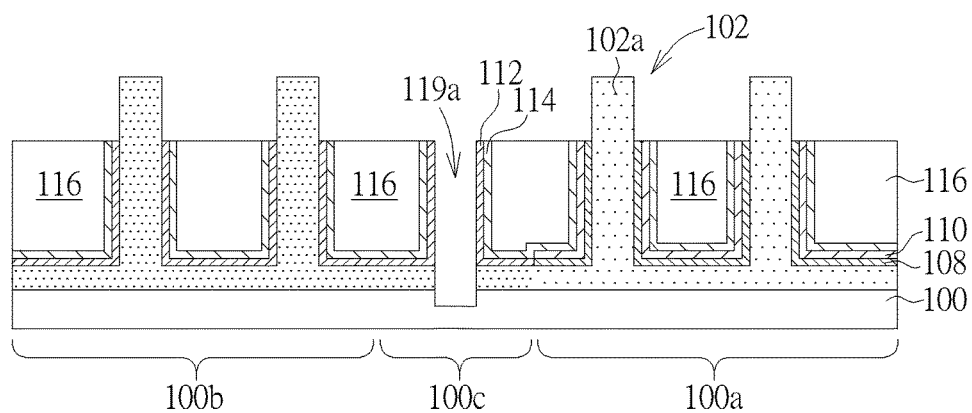
FIG. 9 is a cross-sectional view schematically illustrating the semiconductor structure in accordance with another embodiment of the present invention.

In another embodiment of the present invention, as shown in FIG. 9, the fin 102 may be completely removed to create a fin-free dummy region 100c between the first region 100a and the second region 100b. The trench 119a formed by the removal of the fin 102 may extend into the substrate 100 to a level lower than the doped portion.

Figure 10:
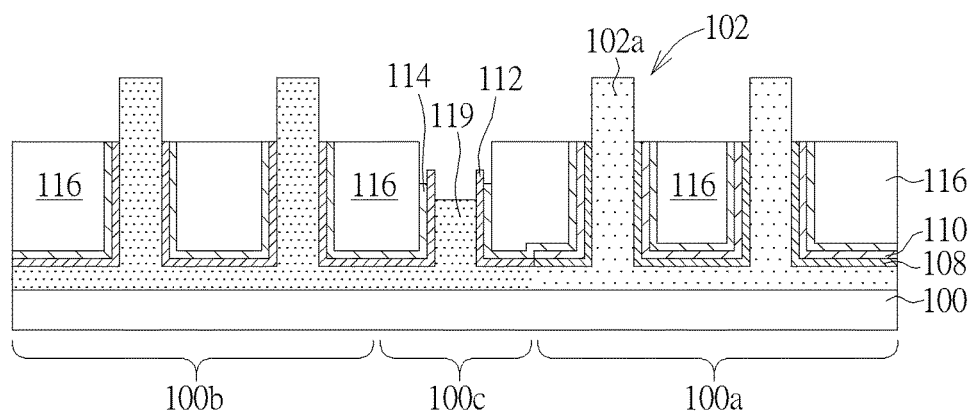
FIG. 10 is a cross-sectional view schematically illustrating the semiconductor structure in accordance with still another embodiment of the present invention.

In still another embodiment of the present invention, the cutting process may also recess the exposed second solid-state dopant source layer 112 and the second insulating buffer layer 114 to a level lower than the top surface of the dielectric layer 116. More specifically, the cutting process has different etching rates for the second solid-state dopant source layer 112 and the second insulating buffer layer 114, so that the top surface of the second solid-state dopant source layer 112 would higher than the top surface of second insulating buffer layer 114 at both sides of the dummy fin 119 as shown in FIG. 10, and the top surfaces of both layer are both higher than the top surface of the dummy fin 119.

Figure 11:
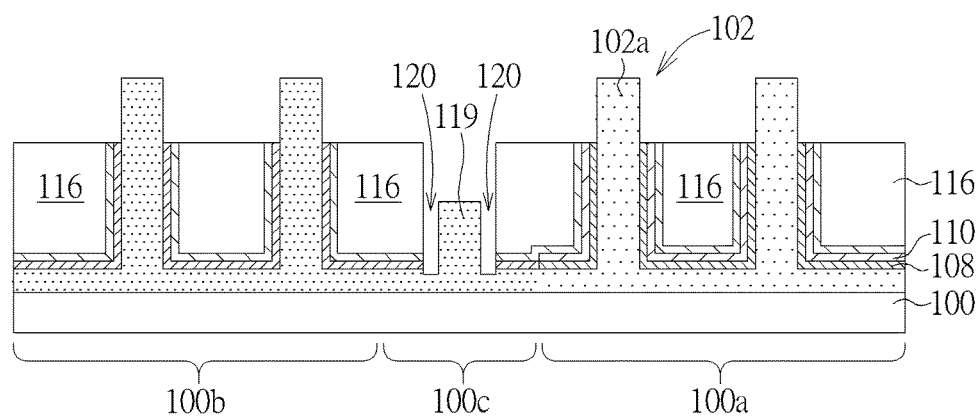
FIG. 11 is a cross-sectional view schematically illustrating the semiconductor structure in accordance with still another embodiment of the present invention.

In still another embodiment of the present invention, the cutting process may have quite larger etching rates for the second solid-state dopant source layer 112 and the second insulating buffer layer 114 rather than the fins 102, so that the second solid-state dopant source layer 112 and the second insulating buffer layer 114 would be completely removed by the cutting process at both sides of the dummy fin 119 to form two grooves 120 between the dummy fin 119 and the dielectric layer 116 as shown in FIG. 11. The groove 120 may extend slightly into the doped portion in the substrate 100.

Figure 12:
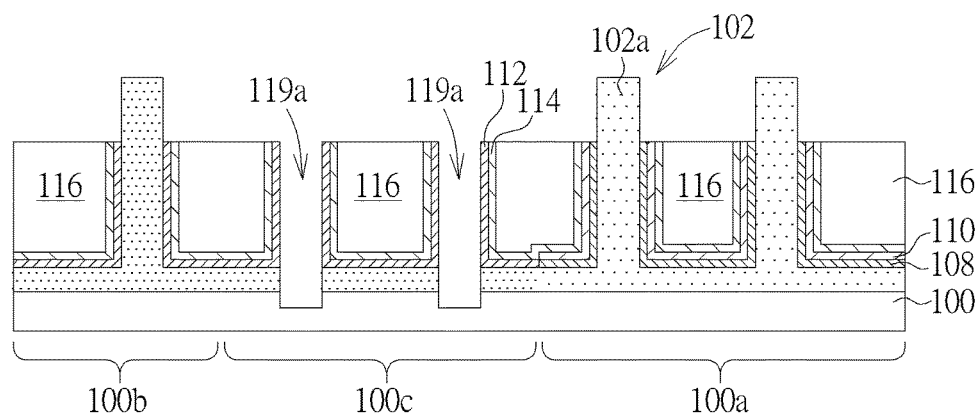
FIG. 12 is a cross-sectional view schematically illustrating the semiconductor structure in accordance with still another embodiment of the present invention.

In still another embodiment of the present invention, as shown in FIG. 12, there may be more than one fin 102 been cut out in the cutting process, depending on the area of the dummy region 100c. At least two trenches 119a are formed in the dummy region 100c.

Figure 13:
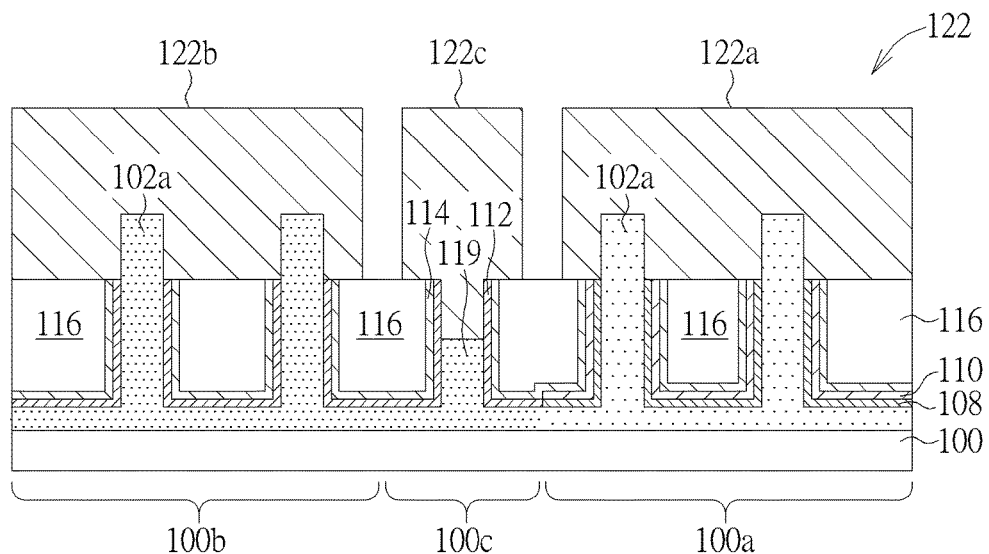
FIG. 13 is a cross-sectional view schematically illustrating a gate electrode formed on fins and dummy fins in accordance with still another embodiment of the present invention.

Next, as shown in FIG. 13, a gate electrode 122 is formed on the dielectric layer 116. The gate electrode 122 may traverse the protruding portions 102a of each fin 102 and completely cover the dummy region 100c. According to the embodiment of the invention, the gate electrode 122 may include a metal gate, which may be formed by a replacement metal gate process. For example, first forming dummy gates and an interlayer dielectric on the substrate and the fins, and the dummy gates are then removed and replaced with metal material to form metal gate. Source and drain regions (not shown) are then formed in the protruding portions 102a of each fin 102, on two opposite sides of the gate electrode 122, and the SiGe or SiP epitaxy may be subsequently formed in the source and drain regions.

Finally, according to the embodiment of the invention as shown in FIG. 13, there is further included a step of cutting the gate electrode 122 into a plurality of gate segments 122a, 122b, 122c for different regions. Other conventional components, such as high-k layer, work function layer, or low resistance layer, will not be shown in FIG. 12 for the concise and simplicity of the drawings.

Figure 14:
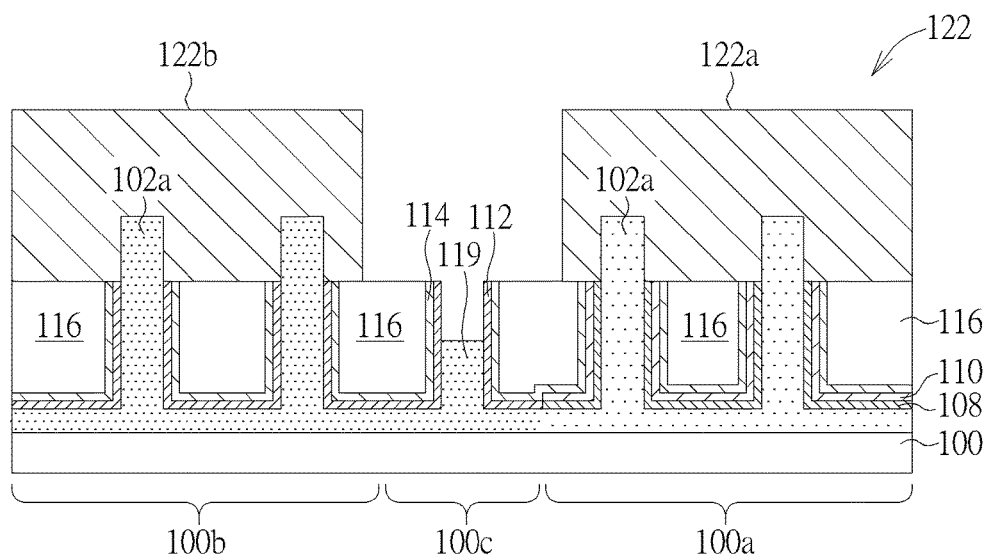
FIG. 14 is a cross-sectional view schematically illustrating no gate electrode is formed on the dummy fin in accordance with still another embodiment of the present invention.

In other embodiment, as shown in FIG. 14, the dummy region 100c and the dummy fin 119 may not be provided with gate electrode 122. The gate segment 122c once provided on the dummy fin 119 in FIG. 13 is removed during the cutting of gate electrode 122.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate having a first region, a second region and a dummy region between the first region and the second region;
   a plurality of fins in the first region and the second region;
   at least one trench is provided in the dummy region, wherein a width of the trench is same as a width of the fin;
   at least one dummy fin in the trench of the dummy region;
   a first solid-state dopant source layer in the first region,
   a first insulating buffer layer on the first solid-state dopant source layer;
   a second solid-state dopant source layer in the second region and the dummy region;

a second insulating buffer layer on the second solid-state dopant source layer; and a dielectric layer on the substrate;

wherein a top surface of the dielectric layer, the second insulating buffer layer, the first insulating buffer layer, the first solid-state dopant source layer and the second solid-state dopant source layer are lower than a top surface of the fins, and a bottom surface of the trench in the dummy region is lower than the dielectric layer.

2. The semiconductor device according to claim 1, wherein the top surface of the second insulating buffer layer is lower than the top surface of the second solid-state dopant source layer at both sides of the dummy fin.

3. The semiconductor device according to claim 1, wherein a top surface of the dummy fin is lower than the top surface of the dielectric layer, the second insulating buffer layer, the first insulating buffer layer, the first solid-state dopant source layer and the second solid-state dopant source layer.

4. The semiconductor device according to claim 1, further comprising two grooves respectively between the dummy fin and the dielectric layer at both sides of the dummy fin.

5. The semiconductor device according to claim 1, wherein the second insulating buffer layer covers on the first insulating buffer layer in the first region.

6. The semiconductor device according to claim 1, further comprising a metal gate traversing the fins and covering the dummy region.

7. The semiconductor device according to claim 1, wherein the first solid-state dopant source layer comprises a borosilicate glass (BSG) layer.

8. The semiconductor device according to claim 1, wherein the second solid-state dopant source layer comprises a phosphosilicate glass (PSG) layer or an arsenic silicate glass (AsSG) layer.

9. The semiconductor device according to claim 1, wherein the first insulating buffer layer and the second insulating buffer layer comprise silicon nitride.

* * * * *